(12) United States Patent
Varnica et al.

(10) Patent No.: US 8,938,660 B1
(45) Date of Patent: Jan. 20, 2015

(54) SYSTEMS AND METHODS FOR DETECTION AND CORRECTION OF ERROR FLOOR EVENTS IN ITERATIVE SYSTEMS

(71) Applicant: Marvell International Ltd., Hamilton (BM)

(72) Inventors: Nedeljko Varnica, San Jose, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 140 days.

(21) Appl. No.: 13/648,171

(22) Filed: Oct. 9, 2012

Related U.S. Application Data

(60) Provisional application No. 61/545,547, filed on Oct. 10, 2011.

(51) Int. Cl.
*H03M 13/00* (2006.01)
*H03M 13/29* (2006.01)
(52) U.S. Cl.
CPC .......... H03M 13/00 (2013.01); H03M 13/2963 (2013.01)
USPC ........... 714/774; 714/755; 714/786; 714/785; 714/759
(58) Field of Classification Search
CPC ........... G11B 20/1809; G11B 20/1833; G11B 20/1866; H03M 13/00; H03M 13/15; H03M 13/2903; H03M 13/2963; H03M 13/2984; H03M 13/2987; H03M 13/31; H03M 13/6343
USPC ......... 714/774, 759, 755, 786, 785, 704, 708, 714/756, 765, 804
See application file for complete search history.

(56) References Cited

U.S. PATENT DOCUMENTS

| 4,541,091 | A | * | 9/1985 | Nishida et al. | 714/756 |
| 2006/0156171 | A1 | * | 7/2006 | Kuznetsov et al. | 714/755 |

* cited by examiner

*Primary Examiner* — Guy Lamarre

(57) ABSTRACT

Methods and apparatuses are provided for decoding a codeword using an iterative decoder. The iterative decoder, in a first decoding mode, performs a number of channel iterations on the codeword, determines a first syndrome weight after a first time period, and determines a second syndrome weight after a second time period. Each channel iteration includes an iteration of the channel detector and at least one iteration of the inner iterative decoder. The iterative decoder, in a second decoding mode, determines a true syndrome of the codeword, and processes the codeword based on the true syndrome of the codeword. The codeword is processed using the second decoding mode in response to determining that the first and second determined syndrome weights are less than a syndrome weight threshold.

16 Claims, 8 Drawing Sheets

| Syndrome Weight | Syndrome Pattern | | | Symbol Pattern | | |
|---|---|---|---|---|---|---|
| | Syndrome Circulant | Syndrome Shift | Syndrome Value | Symbol Circulant | Symbol Shift | Symbol Value |
| 2 | 0 1 | 0 63 | 2 3 | 0 2 10 43 87 | 1 27 13 20 | 3 2 2 1 3 |
| | 12 24 | 0 87 | 3 1 | 3 23 48 50 67 77 | 3 48 55 43 83 74 | 2 3 2 1 1 3 |
| 3 | 0 1 13 | 0 28 84 | 2 1 3 | 0 3 27 32 | 7 25 37 64 | 3 2 1 2 |
| | ... | ... | ... | | | |
| 4 | 0 0 4 12 | 0 29 68 89 | 3 3 2 1 | 27 12 22 47 50 76 | 37 84 35 1 27 36 | 1 3 2 1 2 3 1 |

FIG. 7

SYSTEMS AND METHODS FOR DETECTION AND CORRECTION OF ERROR FLOOR EVENTS IN ITERATIVE SYSTEMS

CROSS-REFERENCE TO RELATED APPLICATIONS

This claims the benefit under 35 U.S.C. §119(e) of U.S. Provisional Application No. 61/545,547, filed Oct. 10, 2011, which is hereby incorporated by reference here in its entirety.

FIELD OF USE

The present disclosure relates generally to error correcting systems and methods, and more particularly, to detecting and correcting near-codewords in iterative decoders for data encoded with a non-binary low-density parity check (LDPC) encoder.

BACKGROUND OF THE DISCLOSURE

An LDPC code is an error-correcting code that may be used in the transmission of information through a noisy communications channel, with or without memory. A variety of LDPC decoding techniques may be used to recover and correct the information received from the channel, most of which are iterative in nature.

In the case of a memoryless channel, an LDPC decoder may directly receive log-likelihood-ratio (LLR) information, a bit reliability metric representative of the encoded data received from the channel, for use in the decoding operation. In the case of a channel with memory, a soft-in soft-out (SISO) channel detector, such as a soft output Viterbi algorithm (SOVA) detector, may be used in conjunction with the LDPC decoder. The decoding operation may alternate between use of the SISO channel detector and the LDPC decoder in order to decode the data. In particular, LLR information may be passed from the SISO channel detector to the LDPC decoder for use in the next LDPC decoding iteration and vice versa, in an iterative process that may be repeated, as desired, in order to improve data reliability.

LDPC codes may be represented by many different types of parity check matrices. The structure of an LDPC code's parity check matrix may be, for example, random, cyclic, or quasi-cyclic. LDPC codes defined by quasi-cyclic parity check matrices are particularly common and computationally efficient. These codes are known as quasi-cyclic low density parity check (QC-LDPC) codes.

A parity check matrix representative of a particular LDPC code may correspond to a bi-partite graph with check nodes and variable nodes. An LDPC decoder may decode received codewords using an iterative message-passing algorithm, in which each iteration or sub-iteration includes two update steps involving the variable nodes and check nodes. (As used herein, the term "message" refers to a numerical value, usually representing an LLR.) In the first update step, messages may be passed from some (or all) check nodes to some (or all) variable nodes, and in the second update step, messages may be passed from some (or all) variable nodes to some (or all) check nodes.

An LDPC decoder may perform the update steps in accordance with a serial (layered) or flooding decoding schedule. In the flooding technique, all check nodes may be updated before a variable node may be updated. Additionally, all variable nodes may be updated before a check node may be updated. In layered decoding, on the other hand, only those variable nodes necessary for updating a particular check node may be updated; or only those check nodes necessary for updating a particular variable node may be updated. An LDPC decoder that uses a layered update schedule for the message passing algorithm is herein referred to as a layered LDPC decoder.

Many iterative decoders currently iterate up to some predetermined number of iterations or until a correct codeword is detected. This, however, can be inefficient. For example, in some situations, near-codewords may arise that may never converge to a correct codeword even with significantly more iterations than the predetermined number of iterations.

Therefore, it would be desirable to provide LDPC decoders that can detect and correct near-codewords before the decoder iterates up to the predetermined number of iterations. Detecting and correcting the near-codewords may improve system performance and reduce the number of errors.

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

SUMMARY OF THE DISCLOSURE

In accordance with some embodiments, there is provided a method for decoding a codeword using an iterative decoder which includes a channel detector and an inner iterative decoder. The method includes, in a first decoding mode, performing a number of channel iterations on the codeword using the iterative decoder, determining a first syndrome weight after a first time period in the first decoding mode, and determining a second syndrome weight after a second time period in the first decoding mode. Each channel iteration includes an iteration of the channel detector and at least one iteration of the inner iterative decoder.

The also method includes, in a second decoding mode, determining a true syndrome of the codeword, and processing the codeword based on the true syndrome of the codeword. The codeword is processed using the second decoding mode in response to determining that the first and second determined syndrome weights are less than a syndrome weight threshold.

In some implementations, the true syndrome includes a syndrome weight, at least one syndrome location, and at least one symbol value corresponding to the syndrome weight.

In some implementations, the inner iterative decoder is a non-binary Quasi-Cyclic LDPC decoder. The lookup table includes a plurality of true syndrome patterns and related symbol patterns for each of the plurality of true syndrome patterns used in processing the codeword. The syndrome pattern includes at least one symbol location and at least one symbol value used in decoding the codeword based on non-binary Quasi-Cyclic LDPC codes.

In some implementations, the method includes, in the first decoding mode, determining a third syndrome weight after a third time period in the first decoding mode. The first, second and third time periods are within the at least one iteration of the inner iterative decoder of a channel iteration. The codeword is processed using the second decoding mode in response to determining that the first, second and third determined syndrome weights are less than a syndrome weight threshold.

In some implementations, the determined first and second syndrome weights are approximations of the syndrome weight.

In accordance with some embodiments, there is provided an iterative decoder for decoding a codeword. The iterative decoder includes a channel detector, an inner iterative decoder, and a lookup table. The iterative decoder is configured to, in a first decoding mode, perform a number of channel iterations on the codeword using the iterative decoder, determine a first syndrome weight after a first time period in the first decoding mode, and determine a second syndrome weight after a second time period in the first decoding mode. Each channel iteration includes an iteration of the channel detector and at least one iteration of the inner iterative decoder. The iterative decoder is also configured to, in a second decoding mode, determine a true syndrome of the codeword, and process the codeword based on the true syndrome of the codeword. The codeword is processed using the second decoding mode in response to determining that the first and second determined syndrome weights are less than a syndrome weight threshold.

In some implementations, the inner iterative decoder is a non-binary Quasi-Cyclic LDPC decoder. The lookup table includes a plurality of true syndrome patterns and related symbol patterns for each of the plurality of true syndrome patterns used in processing the codeword. The syndrome pattern includes at least one symbol location and at least one symbol value used in decoding the codeword based on non-binary Quasi-Cyclic LDPC codes.

In some implementations, the iterative decoder is configured to, in the first decoding mode, determine a third syndrome weight after a third time period in the first decoding mode, and the first, second, and third time periods are within the at least one iteration of the inner iterative decoder of a channel iterative.

In accordance with some embodiments, there is provided a method for decoding a codeword based on non-binary Quasi-Cyclic LDPC codes. The method includes determining a plurality of syndrome metrics for a codeword, comparing the plurality of syndrome metrics for the codeword with a known error pattern, and in response to determining that the plurality of syndrome metrics matches the known error pattern, decoding the codeword using symbol values based on a known symbol pattern corresponding to the matched known error pattern.

In some implementations, the method includes determining a delta shift value based on the plurality of syndrome metrics for the codeword, comparing the plurality of syndrome metrics for the codeword and the delta shift value with the known error pattern, and in response to determining that the plurality of syndrome metrics and the delta shift value matches the known error pattern, determining modified symbol locations based on the delta shift value using the known symbol pattern corresponding with the matched known error pattern, and decoding the codeword using symbol values based on the known symbol pattern and the modified symbol locations.

In some implementations, the plurality of syndrome metrics includes syndrome shift values, and determining the delta shift value comprises calculating the delta shift value from the syndrome shift values.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which:

FIG. 7 shows an illustrative sample of a table that stores information related to known near-codewords in accordance with some embodiments.

DETAILED DESCRIPTION

Systems and methods are provided for enhancing the performance and throughput of a non-binary low-density parity check (LDPC) decoder. In some embodiments, the enhanced performance and throughput may be achieved by detecting and correcting near-codewords before the decoder iterates up to a predetermined number of iterations. In some embodiments, a near-codeword decoder runs concurrently with the LDPC decoder to correct a near-codeword when the near-codeword is detected. In alternate embodiments, the near-codeword decoder is active while the LDPC decoder is not active. Both embodiments allow for on-the-fly codeword error corrections that improve the performance (e.g., reducing the number of errors) without decreasing the throughput of the decoder.

As used herein, "information" and "data" refer to any unit or aggregate of energy, signals, or values that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
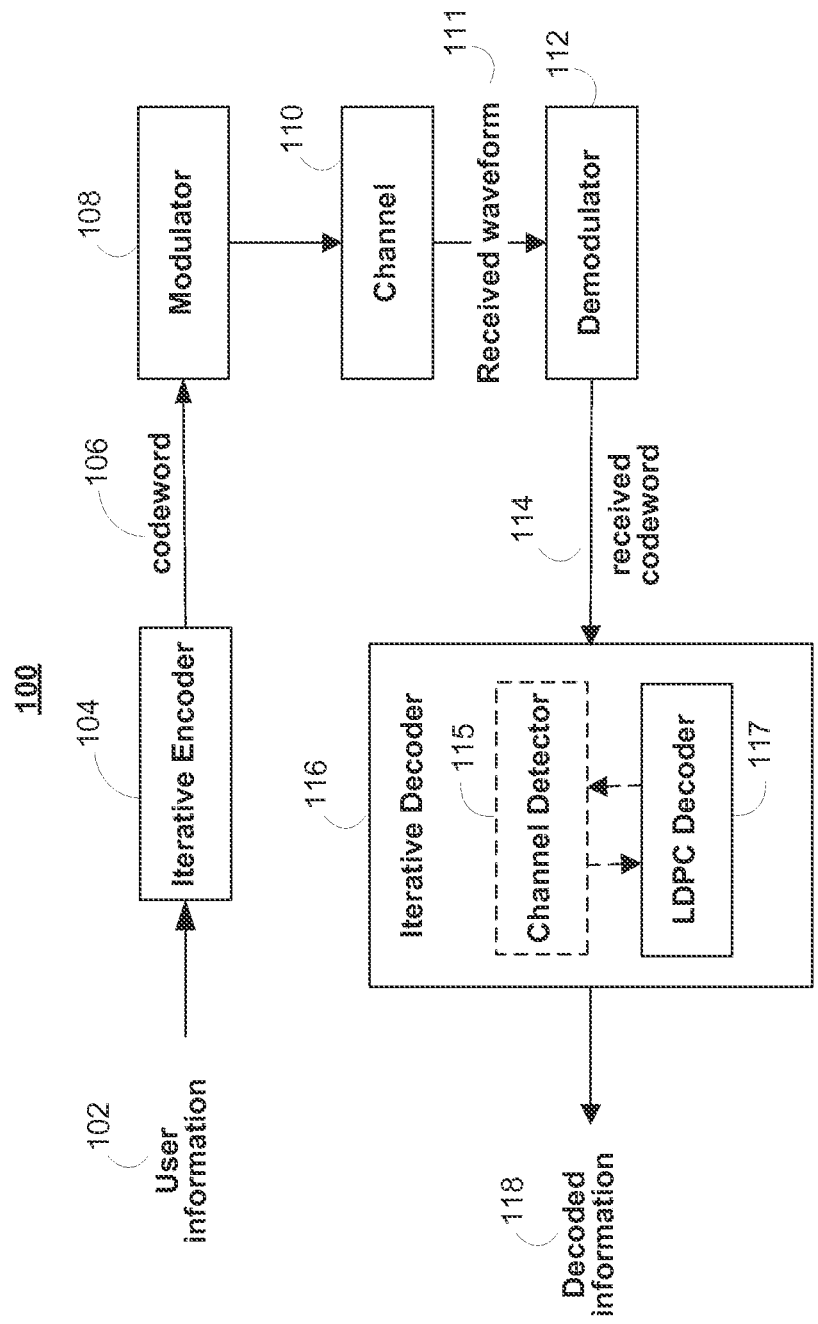
FIG. 1 shows an illustrative communication or data storage system that utilizes error-correcting low-density parity check (LDPC) codes for achieving reliable communication or storage in accordance with some embodiments.

FIG. 1 shows an illustrative communication or data storage system 100 that utilizes non-binary Quasi-Cyclic error-correcting low-density parity check (LDPC) codes for achieving reliable communication or storage in accordance with some embodiments. User information 102 is encoded through LDPC encoder 104. User information 102, may be referred to as the message information or a message vector, may be grouped into units of k symbols, where each symbol is non-binary. Non-binary symbol may be implemented as elements of a Galois Field (GF) with order greater than 2. The result of encoding user information 102 is codeword 106. Codeword 106 may be of a predetermined length. Although the symbols described are with respect to non-binary symbols, the methods and systems described may be used with binary symbols.

In one implementation, codeword 106 is passed to a modulator 108. Modulator 108 prepares codeword for transmission on channel 110. Modulator 108 may use phase-shift keying, frequency-shift keying, quadrature amplitude modulation, or any suitable modulation technique to modulate codeword 106 into one or more information-carrying signals. Channel 110 may represent media through which the information-carrying signals travel. For example, channel 110 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received vector 114, which may contain errors due to channel corruption.

Received vector 114 may then be processed by iterative decoder 116. Iterative decoder 116 may be used to correct or detect errors in received vector 114. In some embodiments, iterative decoder 116 may include a trapping set detector and a near-codeword decoder that can detect and correct, respectively, trapping sets and/or near-codewords. Iterative decoder 116 may include an LDPC decoder 117 and, in some embodiments, a channel detector 115. Channel detector 115 may be implemented as a Soft-Output Viterbi Algorithm (SOVA) detector. Iterative decoder 116 may use an iterative message passing algorithm to correct or detect errors in received vector 114 in order to output decoded information 118.

Herein, a channel iteration refers to an iteration between a channel detector and an inner iterative decoder (e.g., LDPC decoder). For example, a channel iteration may refer to the repetitions of information passing between channel detector 115 and LDPC decoder 117. An LDPC iteration refers to iterations within an LDPC decoder (e.g., a flooding decoder or a layered decoder), for example, repetition of calculations within LDPC decoder 117. The processing of a layer of a layered LDPC decoder is herein referred to as a sub-iteration. Examples for detecting and correcting trapped error states are described herein in terms of one or more types of iteration (e.g., channel iteration, LDPC iteration, or sub-iteration), however, it should be noted that such examples are made for illustrative purposes and may be applied to other types of iterations without departing from the scope of the disclosure. For example, an example described in terms of a sub-iteration may equally apply to LDPC iterations without departing from the scope of the disclosure.

Figure 2:
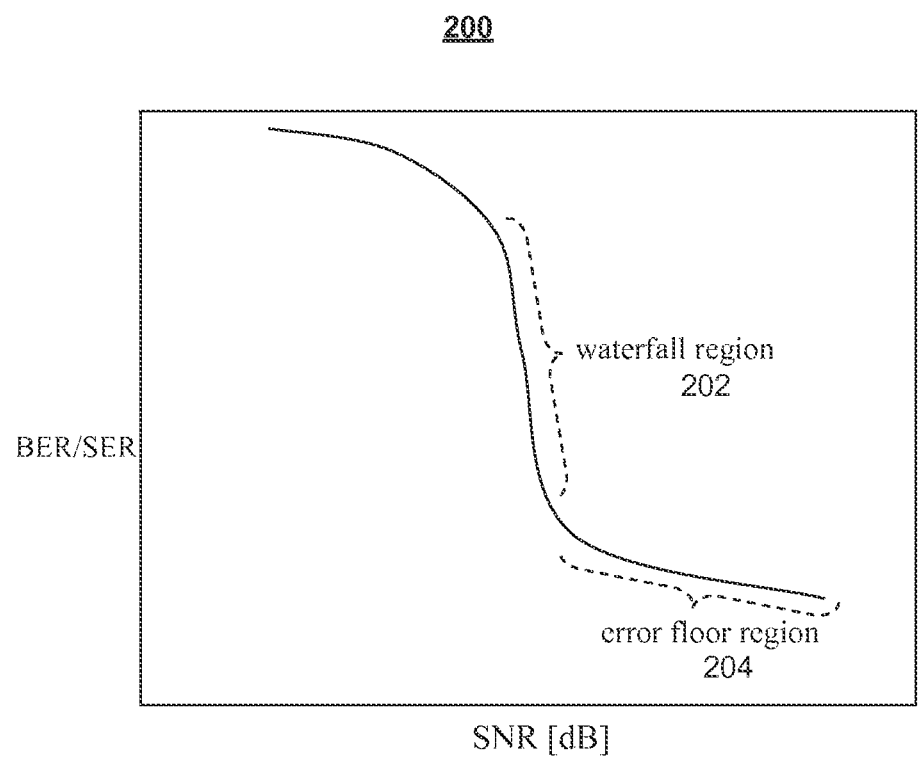
FIG. 2 shows an illustrative graph of regions of error at various signal-to-noise-ratios (SNRs) in accordance with some embodiments.

FIG. 2 shows an illustrative graph of regions of error at various signal-to-noise-ratios (SNRs) in accordance with some embodiments. As mentioned previously, the performance capability of LDPC codes, as described by a mapping of bit error rate (BER)/symbol error rate (SER) to SNR, generally comprises two regions of operation: the waterfall region and the error floor region. FIG. 2 shows an exemplary LDPC performance curve 200 with waterfall region 202 and error floor region 204. In error floor region 204, the BER/SER of the LDPC code disadvantageously asymptotes to a lower limit. Because the normal operating conditions for a communication/storage channel may be in error floor region 204, lowering the error floor may improve the performance of the LDPC code in terms of BER/SER. In some applications, such as data storage, the required SER may be very low, for example, 1e-12. Many systems may not be able to approach these low levels of SER because their error floors are too high.

In some embodiments, the error floor may be lowered by the detection and correction of trapping sets and/or near-codewords, and, hence, the performance of the systems may improve. The detection and correction of the most dominant near-codewords may significantly lower the error floor. Near-codewords herein are vectors that are relatively close to a correct codeword. In other words, a near-codeword differs from a correct codeword in a relatively small number of positions. For example, a near-codeword may satisfy almost all of the check nodes, except for one or two. In some embodiments, a vector may be considered a near-codeword when any suitable small number of check nodes are unsatisfied, for example, at least one check node is unsatisfied. In some embodiments a near-codeword may be referred to as trapping set and vice-versa. Examples with reference to a near-codeword will be used throughout this disclosure. However, near-codeword and/or trapping set detection and correction mechanisms described herein in connection with FIGS. 3-8 may apply equally to near-codewords and trapping sets.

Near-codewords may be caused by "trapped errors," which are errors that the standard decoder may be unable to correct even if the decoder were able to iterate beyond the threshold number of iterations or sub-iterations. For example, a decoder may be considered to be in a trapped error state when it encounters a steady-state error wherein an incorrect value associated with a variable node and/or a check node does not change after some predetermined number of iterations. A decoder may also be considered trapped when it encounters an oscillating-state error wherein an incorrect value associated with a variable node and/or a check node changes in some periodic fashion after some predetermined number of iterations or sub-iterations. For example, a value associated with a variable node may change from 'A' to 'B', then back to 'A' and once again to 'B', and so on, periodically. An error may be considered an oscillating-state error for any number of suitable periodic values. For example, a variable node value may change from 'A' to 'B' to 'C', then back to 'A', then to 'B', and then to 'C', and so on, periodically. For simplicity, examples detected and corrected errors herein are described in terms of steady-state and/or oscillating-state errors. However, it should be noted that any other suitable type of trapped error and/or trapped error state may be detected and corrected without departing from the scope of this disclosure.

Figure 3:
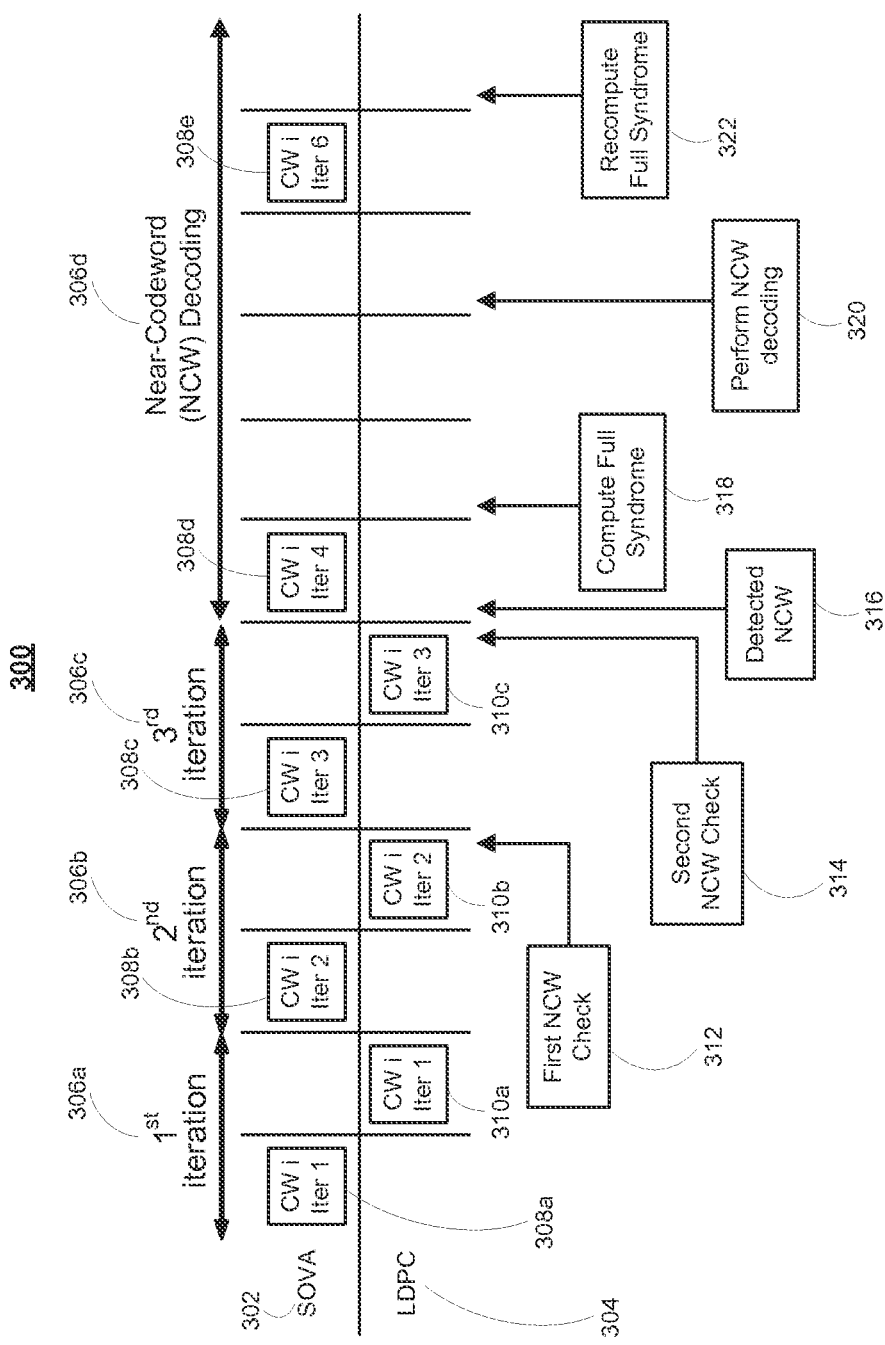
FIG. 3 shows an illustrative timing diagram for detecting and decoding a near-codeword during multiple channel iterations of the iterator decoder in accordance with some embodiments.
Figure 4:
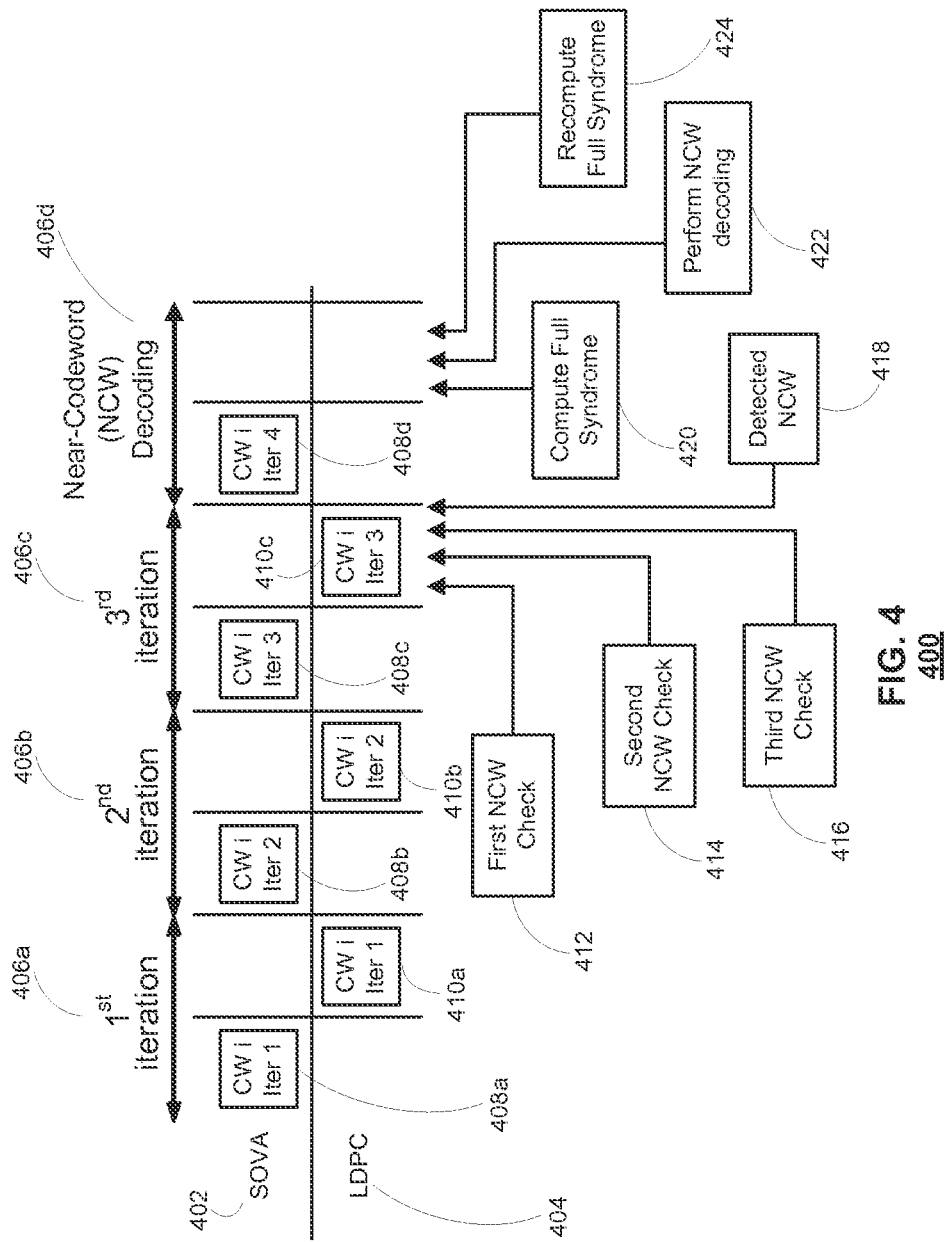
FIG. 4 shows an illustrative timing diagram for detecting and decoding a near-codeword during the same channel iterations of the iterator decoder in accordance with some embodiments.

In some embodiments, it may be possible to detect that a near-codeword has occurred during iterations and then attempt to correct the near-codeword before the threshold number of iterations occurs. For example, a near-codeword may be detected at any suitable time during a channel iteration, LDPC iteration, or a sub-iteration. FIGS. 3 and 4 depict illustrative simplified block diagram of near-codeword decoder 610 for detecting, for example, steady-state and oscillating-state errors. In some embodiments, near-codeword decoder 610 may be included in or be in communication with an iterative decoder, for example, iterative decoder 116 of FIG. 1.

FIG. 3 shows an illustrative timing diagram for detecting and decoding a near-codeword during multiple channel iterations 306a-c of the iterator decoder 116 in accordance with some embodiments. As described in FIG. 1, a received vector 114 may be processed by iterative decoder 116. Iterative decoder may include an LDPC decoder 117 and a channel detector 115 implemented as a SOVA detector. Each channel iteration 306a-c iterates between a channel detector 302, such as channel detector 115 of FIG. 1, and an LDPC decoder 304, such as LDPC decoder 117 of FIG. 1. These iterations are represented in FIG. 3 by channel detector blocks 308a-c and LDPC decoding blocks 310a-c, which represent the periods of time wherein the channel detector is processing information and wherein the LDPC decoder is processing information, respectively.

In some embodiments, a near-codeword may be detected over multiple channel iterations of the iterative decoder. For example, after the LDPC decoder has processed the codeword, during LDPC decoding block 310b, in channel iteration 306b, a near-codeword check may be performed. A first near-codeword check 312 may include computing a syndrome weight and determining whether the computed syndrome weight, after LDPC decoding block 310b has been performed, is less than a syndrome weight threshold. If the computed syndrome weight is less than the threshold, a flag may be set indicating that a near-codeword may have been detected. A flag may be a stored value or signal, which may be stored in a buffer or memory. The flag may indicate a true or false value, using a 1 or a 0, respectively.

In some embodiments, the computed syndrome weight may be an approximate of the syndrome weight and not the true syndrome weight calculation. A true syndrome weight is the syndrome weight calculation for the codeword. An approximate of the syndrome weight may include estimating the syndrome weight based on information available from a particular implementation of the LDPC decoder 304. For example, changes in the check node values during the check node updates may be used to estimate the syndrome weight. The approximate of the syndrome weight may be calculated in less time and may be close to the true syndrome weight.

A second near-codeword check 314 may be performed in the subsequent channel iteration, during LDPC decoding block 310c, in channel iteration 306c. Similar to the first near-codeword check 312, a computed syndrome weight may be determined during the second near-codeword check 314 and may be compared to the syndrome weight threshold. If the computed syndrome weight is less than the threshold, a different flag may be set indicating that a near-codeword may have been detected.

A near-codeword detection 316 may be performed after the second near-codeword check 314. The near-codeword detection 316 may check whether a near-codeword has been detected during consecutive channel iterations. If near-codeword flags were set during consecutive channel iterations, the near-codeword detector indicates that a near-codeword detection event has occurred. A near-codeword detection event indicates to the iterative decoder that the codeword should be processed with a near-codeword decoding process 306d. In some embodiments, the syndrome weight may be computed. If the syndrome weight is equal to 0, the codeword has been decoded and the process quits. If a near-codeword event has not occurred, the iterative decoder continues processing the codeword in subsequent channel iterations, until a near-codeword event occurs or a pre-determined number of channel iterations have been reached.

In some embodiments, the number of consecutive channel iterations where a near-codeword flag was set may be more than two. The number of consecutive channel iterations where a near-codeword flag was set may be any number less than the pre-determined number of channel iterations for the iterative decoder. In some embodiments, the syndrome weight threshold may be different for each near-codeword check (e.g., first near-codeword check 312 and second near-codeword check 314). The syndrome weight threshold may be based on whether a near-codeword flag was set or not set during a previous channel iteration.

After the near-codeword event has been indicated, after LDPC decoding block 310c, the iterative decoder may start processing the detected near-codeword in a near-codeword decoding process 306d. The iterative decoder may compute the true syndrome of the codeword. The true syndrome includes a syndrome weight, syndrome locations, and syndrome values computed for the codeword. Using the computed true syndrome, near-codeword decoding 320 is performed. Near-codeword decoding 320 may include decoding the codeword using a near-codeword look-up table. The computed true syndrome may be used to locate an error pattern in the near-codeword look-up table and generate codeword symbol values from entries in the near-codeword look-up table to decode the codeword. The true syndrome may be re-computed to verify that the codeword has been decoded properly. If the syndrome weight is not equal to 0, a near-codeword decoding failure may be indicated, indicating that the codeword was not successfully decoded. If the syndrome weight is equal to 0, a near-codeword decoding success may be indicated, indicating that the codeword was successfully decoded.

In some embodiments, the near-codeword decoding process 306d may be performed during the channel detector blocks and LDPC decoding blocks assigned to the codeword assigned. For example, computing the true syndrome, performing the near-codeword decoding, and re-computing the true syndrome may be performed during LDPC decoding blocks which were originally assigned to the codeword for decoding in subsequent channel iterations of the iterative decoder. During these processing block time slots, the LDPC decoder may be used to compute and re-compute the true syndrome. However, during the near-codeword decoding process 320, the LDPC decoder may be idle during the LDPC decoding block. In some embodiments, during the channel detector blocks 308d and 308e, the channel detector may still process the codeword. However, the LLR values generated by the channel detector may be ignored.

In some embodiments, the near-codeword checks and near-codeword detection may be performed within the same channel iteration. In some embodiments, the near-codeword decoding process may also be performed within the same channel iteration. FIG. 4 shows an illustrative timing diagram 400 for detecting and decoding a near-codeword during the same channel iterations 406a-d of the iterative decoder 116 in accordance with some embodiments. Similar to FIG. 3, channel detector 402 and LDPC decoder 404 start processing the codeword. After a first and second channel iteration 406a-b, which includes channel detector block 408a-b and LDPC decoder block 410a-b, a third channel iteration 406c begins.

Channel detector 402 processes the codeword during channel detector block 408c. Then the codeword is processed using the LDPC decoder 404 during LDPC decoder block 410c. During one of the LDPC iterations of the LDPC decoder, the first near-codeword check 412 may be performed. In subsequent LDPC iterations, a second near-codeword check 414 and a third near-codeword check 416 may be performed. Similar to the near-codeword checks 312 and 314 in FIG. 3, the near-codeword checks 412, 414, and 416 may include determining whether a computed syndrome weight, after an LDPC iteration has been performed, is less than a syndrome weight threshold. If the computed syndrome weight is less than the threshold, a flag may be set indicating that a near-codeword may have been detected. Each iteration may have a different flag indicating which iteration the near-codeword has detected.

A near-codeword detection 418 may be performed after a series of near-codeword checks have been performed in consecutive LDPC iterations. The near-codeword detection 418 may check whether a near-codeword has been detected during consecutive LDPC iterations. If near-codeword flags were set during a pre-determined number of consecutive LDPC iterations, the near-codeword detector indicates that a near-codeword detection event has occurred.

After the near-codeword event has been indicated, after LDPC decoding block 410c, the iterative decoder may start processing the detected near-codeword in a near-codeword decoding process 406d. Near-codeword decoding process 406d may be performed during a single channel iteration. For example, computing the true syndrome, performing the near-codeword decoding, and re-computing the true syndrome may be performed during the same LDPC decoding block which was originally assigned to the codeword for decoding in the subsequent channel iteration of the iterative decoder. In some embodiments, during this processing block time slot, the LDPC decoder may be used to compute and re-compute the true syndrome. However, during the near-codeword decoding process 422, the LDPC decoder may be idle during the LDPC decoding block. During the channel detector block 408d, the channel detector may still process the codeword. However, the LLR values generated by the channel detector may be ignored.

Figure 5:
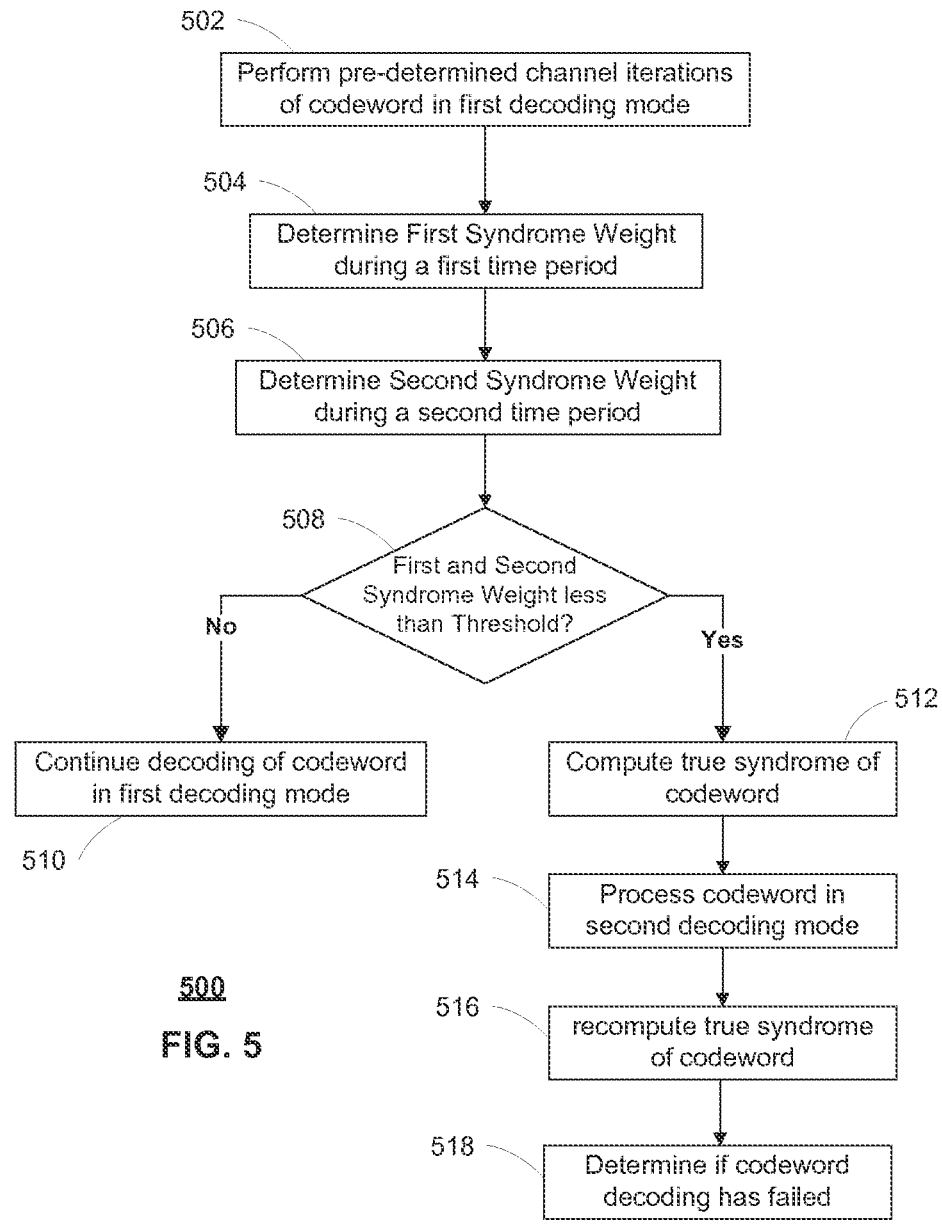
FIG. 5 shows a flowchart of a process for detecting and correcting a near-codeword in accordance with some embodiments.

FIG. 5 shows a flowchart of a process for detecting and correcting a near-codeword in accordance with some embodiments. At 502, the iterative decoder is initialized for a codeword and a pre-determined number of channel iterations are performed on the codeword in an initial decoding mode. The initial decoding mode includes processing the codeword with the channel detector and the LDPC decoder during the pre-determined number of channel iterations. At 504, after a first time period, a first syndrome weight is determined for the codeword. At 506, after a second time period, a second syndrome weight is determined for the codeword. The first and second time period may be a pre-determined channel iteration or after the LDPC decoder has processed the codeword in a pre-determined channel iteration. The second time period occurs after the first time period. In some embodiments, the first and second time period may be within the same channel iteration, and, more specifically, may be subsequent LDPC iterations of the LDPC decoder within the same channel iteration.

At 508, the first and second syndrome weights are compared to a syndrome weight threshold. If both the first and second syndrome weights are not less than the syndrome weight threshold, at 510, the codeword continues to be processed using the initial decoding mode. However, if the first and second syndrome weights are less than the syndrome weight threshold, then the initial decoding mode is stopped and a near-codeword decoding process is performed, beginning at 512. A flag may be set indicating that a near-codeword event has occurred. In some embodiments, the comparison may be performed when the first and second syndrome weights are determined. For example, after each of the syndrome weights are determined, the syndrome weights may be compared to the syndrome weight threshold. If the syndrome weight is less than the syndrome weight threshold, a flag is set indicating that a near-codeword was detected for the syndrome weight. Each syndrome weight may have a different flag. Flags representing syndrome weights of sequential time periods may be compared at each time period or during pre-determined intervals.

At 512, the true syndrome of the codeword is computed. The true syndrome may be computed using the LDPC decoder. The true syndrome may include a syndrome weight, syndrome locations, and syndrome values. The syndrome locations may include syndrome circulant locations and syndrome shift values. At 514, the codeword and computed true syndrome is processed using the near-codeword decoding. The near-codeword decoder receives the computed true syndrome and processes the codeword using the computed true syndrome.

In some embodiments, the codeword is processed using a lookup table which includes syndrome pattern values and symbol pattern values. The syndrome pattern values include syndrome weights, syndrome locations, and syndrome values. The syndrome values may be selected based on the order of the Galois Field (GF) used to generate the LDPC codes. For example, if a GF(4) field is used, the syndrome value may be any of the elements in the Galois Field, except for zero, since a zero syndrome value would indicate that the syndrome was correct and would not be in the lookup table.

The computed true syndrome is compared to the syndrome pattern values in the lookup table. If a syndrome pattern value matches the computed true syndrome of the codeword, then the symbol pattern values may be used in decoding the codeword. The symbol pattern values include symbol circulant locations, symbol shift values, and symbol values. The codeword is processed and decoded with the symbol pattern values, which generate a decoded codeword. At 516, the true syndrome of the decoded codeword is recomputed. At 518, based on the recomputed true syndrome, a determination whether the codeword was successfully decoded is performed. If the true syndrome weight is 0, then an indication that the codeword was decoded successfully occurs. If the true syndrome weight is greater than 0, then an indication that the codeword decoding has failed occurs.

In some embodiments, decoding of the codeword may be allocated more decoding time than the pre-determined number of channel iterations of the iterative decoder. By buffering subsequent codewords to be decoded into buffers, codewords may take decoding time from other codewords. For example, if performing near-codeword decoding on a first codeword requires longer than a channel iteration, the subsequent codeword to be decoded may be stored in a buffer. The first codeword may then utilize the next channel iteration to continue decoding the first codeword. The number of channel iterations which the first codeword may span is based on the number of buffers available. If the buffers become full, near-codeword decoding may not utilize any further channel iterations, and a decoding failure may be indicated. This may be beneficial since the iterative decoder may decode many of the codewords in less than the pre-determined number of channel iterations. Therefore, the extra time remaining may be used by codewords which require extra processing.

Figure 6:
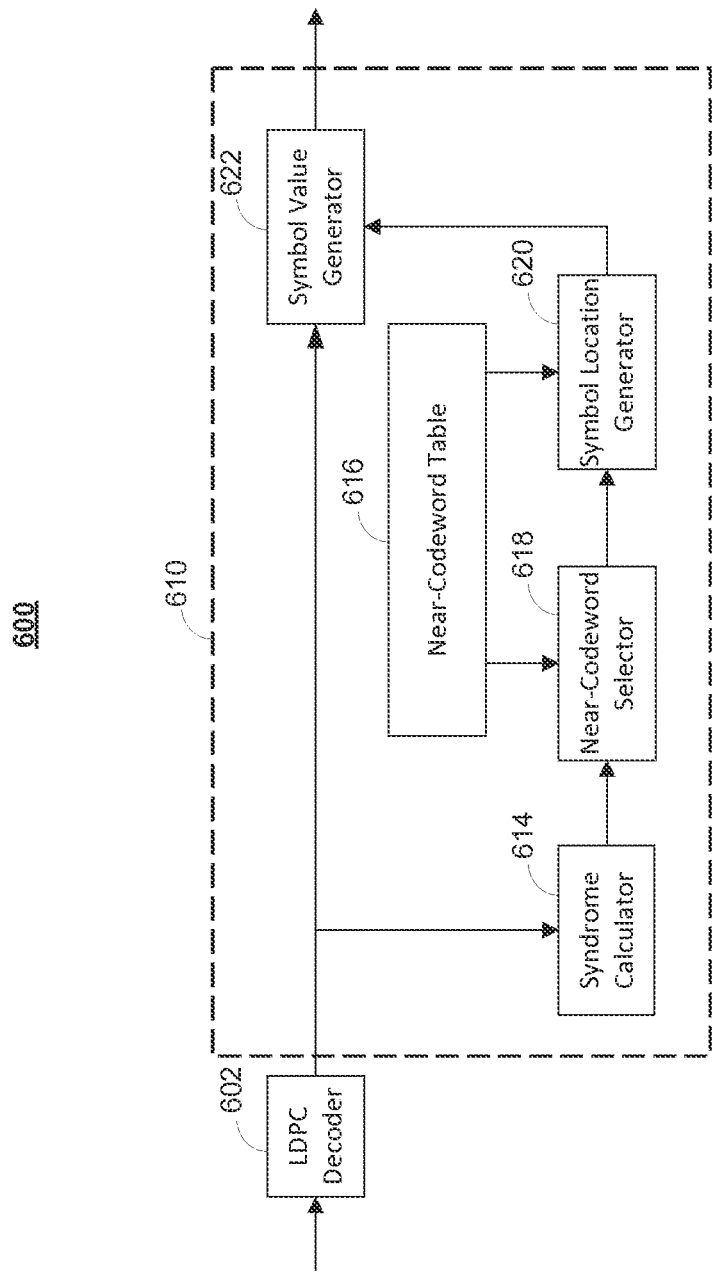
FIG. 6 shows an illustrative simplified block diagram with a near-codeword decoder for correcting detected near-codewords in accordance with some embodiments.

FIG. 6 depicts an illustrative simplified block diagram 600 with near-codeword decoder 610 for correcting, for example, detected near-codewords. Near-codeword decoder 610 may include syndrome calculator 614, near-codeword table 616, near-codeword selector 618, symbol location generator 620, and symbol value generator 622. In some embodiments, near-codeword decoder 610 may be included in, or be in communication with, an iterative decoder, for example, iterative decoder 116 of FIG. 1.

In some embodiments, LDPC decoder 602, which may be substantially similar to LDPC decoder 117 of FIG. 1, may pass a newly decoded near-codeword to near-codeword decoder 610. LDPC decoder 602 may pass the newly decoded near-codeword to decoder 610 when, for example, an indication that a near-codeword has been detected and it is determined that the detected near-codeword should be processed using the near-codeword decoding process. In some embodiments, the near-codeword may be passed from decoder 602 to syndrome calculator 614. In some embodiments, calculator 614 may calculate the syndrome weight of the newly decoded near-codeword, determine which circulants are associated with the error or errors in the near-codeword, and/or determine any other suitable information necessary to correct the error or errors in the newly decoded near-codeword. Upon determining any information necessary to attempt to correct the near-codeword, calculator 614 may output the determined information to near-codeword selector 618.

In some embodiments, near-codeword decoder may compare information determined in syndrome calculator 614 to information stored in near-codeword table 616 using near-codeword selector 618. For example, selector 618 may compare the syndrome weight of the newly detected near-codeword to a syndrome weight of a previously known near-codeword stored in table 616. If selector 618 finds a match in syndrome weights, selector 618 may then attempt to find a match in syndrome circulants and syndrome values where the error or errors occurred in the newly detected near-codeword.

In some embodiments, the newly detected near-codeword and previously known near-codeword may be determined to match when the syndrome circulants associated with the errors in the previously known near-codeword have a shift relationship to the errors in the newly detected near-codeword and the syndrome values at those locations match. The shift relationship may be due to the quasi-cyclic nature of an LDPC parity check matrix. For example, the quasi-cyclic structure of an LDPC matrix may create symmetry in the matrix, for example, between rows of the matrix. For example, errors in a previously known near-codeword may have been associated with syndrome shift location 0 and 63 of circulants 0 and 1, respectively. Syndrome shift locations and check node locations may refer to the same location and may be used interchangeably. If errors in the newly detected near-codeword are associated with syndrome shift locations 5 and 68 of circulants 0 and 1, respectively, the newly detected near-codeword may be considered a match with a 5-node shift to the aforementioned previously known near-codeword. If syndrome values at those locations of the newly detected near-codeword match the syndrome values stored in near-codeword table 616, then near-codeword selector 618 may select the matched entry in near-codeword table 616 and provide it to symbol location generator 620.

In some embodiments, selector 618 may attempt to find a match between the newly detected near-codeword and previously known near-codewords using any suitable data and/or method. Upon finding a match between a newly detected near-codeword and a previously known near-codeword stored in table 616, selector 618 may output information related to the match to symbol location generator 620. For example, selector 618 may output the memory and/or table location of the matched near-codeword in table 616, syndrome shift information, and/or any other suitable relevant information associated with the matched near-codewords.

In some embodiments, near-codeword table 616 may store information related to previously known near-codewords which may be utilized to correct newly detected near-codewords (e.g., near-codewords that had been encountered in prior iterations), for example, by near-codeword selector 618 and symbol location generator 620. Table 616 may be any suitable form of memory or buffer that stores information which may be utilized to correct near-codewords. In some embodiments, if the newly detected near-codeword passed from decoder 602 matches one of the entries stored in table 616, near-codeword decoder 610 may be able to utilize the information in table 616 to correct the error or errors in the near-codeword. In some embodiments, near-codeword decoder 610 may use symbol circulant, symbol shift, and symbol values in table 616 associated with the previously known near-codeword stored in table 616 to correct the errors in the near-codeword.

In some embodiments, near-codeword table 616 may store syndrome weights associated with previously known near-codewords, syndrome and symbol circulants associated with the error or errors in the respective known near-codewords, and any other suitable information that may be utilized to correct near-codewords. In some embodiments, the syndrome shift values may be represented as a 0. This may allow table 616 to avoid storing some information related to the syndrome shift value and may reduce the amount of storage space required by table 616. The information associated with the known near-codewords may be stored in any suitable order. For example, an order that substantially maximizes the speed and efficiency of operation of near-codeword decoder 610. For example, substantially dominant, substantially common, and/or substantially important known near-codewords may be stored near the top of table 616 so that they would be encountered relatively early during the matching search performed by near-codeword selector 618. Conversely, less dominant, less common, and/or less important known near-codewords may be stored in a location in table 616 that would be accessed later during the search conducted by selector 618.

In some embodiments, information stored in near-codeword table 616 may be predetermined. Additionally, the information stored in table 616 may be fixed or may be adaptive. For example, during normal operation of an iterative decoder, new near-codewords may be discovered and/or previously known near-codewords may be determined to be more or less dominant, common, and/or important. Newly discovered and/or corrected near-codewords may be added to table 616 in any suitable location. The storage location in table 616 of previously known near-codewords that are determined to be more or less dominant, common, and/or important may be shifted within table 616 to account for their newly determined relevancy. For example, if a previously known near-codeword is determined to be less dominant than previously determined, information associated with the previously known near-codeword may be moved to a location in table 616 that would be searched later during the matching process performed by selector 618. In some embodiments, previously known near-codewords may be removed entirely from table 616 when determined to be less dominant, common, and/or important.

In some embodiments, architectures that allow processing of multiple near-codewords simultaneously may additionally increase performance of the correction process of the iterative decoder. For example, near-codeword selector 618 may be capable of searching through a greater number of near-codewords in near-codeword table 616 if the near-codeword decoder is implemented with a parallel type architecture. For example, the near-codeword correction processing performance of the decoder may increase by a multiple of the parallelization. For example, the near-codeword corrector may process a table of p*L near-codewords in M clock cycles. Here, M is any suitable number of clock cycle, p represents the parallelization, and L represents the number of near-codewords that the near-codeword corrector may process in M clock cycles when there is no parallelization.

In some embodiments, near-codeword decoder 610 may include, operate substantially simultaneously with, and/or operate in conjunction with additional software and/or hardware for correcting near-codewords. In some embodiments, these additional correcting processes (which are typically slower than the on-the-fly near-codeword corrector described above) may be used to correct previously unknown near-codewords. The additional correction algorithm may then provide information relevant to correcting the previously unknown near-codeword to near-codeword decoder 610 for storage and/or updating to near-codeword table 616. For example, the additional correcting processes may provide relevant syndrome weight, syndrome circulant, syndrome shift, and syndrome value information to table 616. Near-codeword decoder 610 may then utilize the provided information from the additional correcting processes to correct the near-codeword if it is encountered again in future received vectors. For example, for near-codewords that are not present in table 616, the additional correcting process may be able to correct such near-codewords. Then the additional correcting process can provide information regarding which symbols to correct and the correct symbol values themselves in order to transform the near-codeword to a valid codeword to near-codeword decoder 610. Near-codeword decoder 610 may then add this and any other relevant information to table 616 for later use. Therefore, in subsequent received vectors, if such a near-codeword re-occurs, the near-codeword corrector will be able to correct this near-codeword on-the-fly. In some embodiments, a large near-codeword table 616 may increase the performance of near-codeword decoder 610 when compared to smaller tables. In some embodiments, it is not necessary to rerun an iterative decoder when utilizing near-codeword decoder 610. An illustrative example of the contents of table 616 is discussed further below with regard to FIG. 7.

If near-codeword selector 618 detects a match between the newly decoded near-codeword from LDPC decoder 602 and a previously known near-codeword(s) in table 616, as described above, selector 618 may pass information regarding the detected match to symbol location generator 620. For example, selector 618 may output the memory and/or table location of the matched near-codeword in table 616, syndrome shift information, and/or any other suitable relevant information associated with the matched near-codewords. Additionally, selector 618 may provide generator 620 with information related to the newly detected near-codeword. For example, the information related to the error or errors in the newly detected near-codeword that were calculated by calculator 614 may be provided to generator 620. Generator 620 may utilize the information provided by selector 618 to gather any necessary information from table 616. For example, generator 620 may gather information regarding the symbol circulant, symbol shift, and symbol values that are associated with the errors of the previously known matched near-codeword from table 616. Syndrome shift information and variable node locations may refer to the same location and may be used interchangeably.

In some embodiments, symbol location generator 620 may utilize the information provided by near-codeword table 616 and near-codeword selector 618 to determine which symbol locations within the near-codeword should be corrected to attempt to correct the near-codeword. For example, generator 620 may utilize memory and/or table location from selector 618 of the matched near-codeword in table 616 to retrieve related symbol circulant and symbol shift information. For example, related symbol circulant and symbol shift information may be a previously correct near-codeword with matching symbol circulant and symbol shift information as the matched near-codeword. In some embodiments, generator 620 may determine that correcting the symbol values at the symbol circulant and symbol shift locations, as determined from information in table 616, may correct the near-codeword.

In some embodiments, selector 618 may output information to generator 620 that indicates that there is a shift relationship between the matched near-codeword in table 616 and the newly detected near-codeword, as described above. Selector 618 may provide the shift relationship information generated by selector 618. In some embodiments, generator 620 may determine the shift relationship information in a similar way as selector 618. When there is a shift relationship between the matched near-codeword and newly detected near-codeword, generator 620 may apply the determined shift relationship to the symbol shift location of the matched near-codeword to determine the symbol location which should be corrected in the newly detected near-codeword. For example, if there is a shift relationship between syndrome locations of the matched near-codeword and the newly detected near-codeword, there may be an equal shift between symbol locations of the matched near-codeword and the newly detected near-codeword. By applying the shift relationship information to the symbol shift location, the location to correct in the newly detected near-codeword may be determined.

For example, errors in a previously known near-codeword may have been associated with syndrome shift location 0 and 63 of circulants 0 and 1, respectively. If errors in the newly detected near-codeword are associated with syndrome shift location 5 and 68 of circulants 0 and 1, respectively, the two codewords may be considered matched with a cyclic-shift relationship of 5. If shift was 0, table 616 may indicate that the symbol values in the matched near-codeword associated with symbol shift locations 1, 2, 7, 13, and 20 of symbol circulants 0, 2, 10, 43, and 87, respectively, should be corrected using a previously known symbol value in order to correct the matched near-codeword. Generator 620 may, in turn, utilize information associated with the determined shift relationship, as determined by, for example, near-codeword selector 618, to apply an equal shift to the indicated symbol shift locations associated with the matched near-codeword in table 616. For example, generator 620 may apply the cyclic-shift relationship when determining which symbols of the newly detected near-codeword to correct. For example, generator 620 would determine that symbol shift locations 1, 2, 7, 13, and 20 of the previously known near-codeword are substantially equivalent to symbol shift locations 6, 7, 12, 18, and 25 in the newly detected near-codeword by applying the determined cyclic-shift relationship of 5. As such, generator 620 may indicate that symbols associated with symbol shift locations 6, 7, 12, 18, and 25 should be corrected to correct the error or errors in the newly detected near-codeword.

In some embodiments, generator 620 may determine that it is necessary to correct the symbol values associated with the substantially equivalent symbol shift locations of the newly detected near-codeword. For example, generator 620 may determine that symbols in the newly detected near-codeword associated with symbol shift locations 6, 7, 12, 18, and 25 of circulants 0, 2, 10, 43, and 87, respectively, should be corrected to attempt to correct the newly detected near-codeword. In some embodiments, once generator 620 determines which symbols of the newly detected near-codeword to correct, generator 620 may output the determined locations to symbol value generator 622. Symbol value generator 622, may then, in turn, correct the appropriate symbols of the newly detected near-codeword received from LDPC decoder 602 based on the symbol values at the symbol circulant and symbol shift locations received from generator 620 to 622 correct the near-codeword. Once symbol value generator corrects the appropriate symbols, the corrected near-codeword may now be a valid codeword and is output from near-codeword decoder 610 appropriately.

In some embodiments, the corrected near-codeword may be sent back to LDPC decoder 602 or any other suitable element to verify that the corrected near-codeword is a valid codeword. For example, decoder 602 may verify that the corrected near-codeword satisfies all the parity check conditions. In some embodiments, if the corrected near-codeword does not satisfy the parity check conditions or is in some other way determined not to be a valid codeword, the invalid corrected codeword may be sent back to LDPC decoder 602 for further iterations and/or sent back to near-codeword decoder 610 to further attempt to correct the near-codeword.

FIG. 7 depicts an illustrative sample of table 700 associated with information related to known near-codewords, which may be stored in, for example, near-codeword table 616 of FIG. 6. Table 700 may contain any suitable information that may be utilized in correcting near-codewords. In some embodiments, table 700 may be substantially similar to data stored in table 616, as discussed above with regard to FIG. 6. In some embodiments, table 700 may include syndrome weight 702, syndrome pattern information 704, and symbol pattern information 712.

In some embodiments, table 700 may be organized according to syndrome weight, however, any other suitable organization of table 700 may be used. In some embodiments, syndrome pattern information 704 may include syndrome circulant data 706, syndrome shift data 708, and syndrome value 710. Syndrome circulant data 706 corresponds to a syndrome circulant or circulants that are associated with the error or errors in the related known near-codeword. Syndrome shift data 708, or syndrome shift locations, corresponds to a check node or nodes within the corresponding circulants. These check nodes are associated with the error or errors in the related known near-codeword.

In some embodiments, symbol pattern information 712 may include symbol circulant data 714, symbol shift data 716, and symbol value data 718. Symbol circulant data 714 corresponds to a symbol circulant or circulants that are associated with the error or errors in the related known near-codeword. Symbol shift data 716, or symbol shift locations, corresponds to a variable nodes' position within the corresponding circulants. These variable nodes are associated with the error or errors in the related known near-codeword. In some embodiments, symbols in a newly detected near-codeword that is determined to match a near-codeword represented in table 700 may be corrected based on, for example, symbol value data 718, as discussed above with regard to symbol location generator 620 and symbol value generator 622 of FIG. 6. In some embodiments, the symbols in a newly detected near-codeword may be corrected based on a node shift relationship between the newly detected near-codeword and a previously known near-codeword represented in table 700, as discussed above with regard to FIG. 6.

Figure 8:
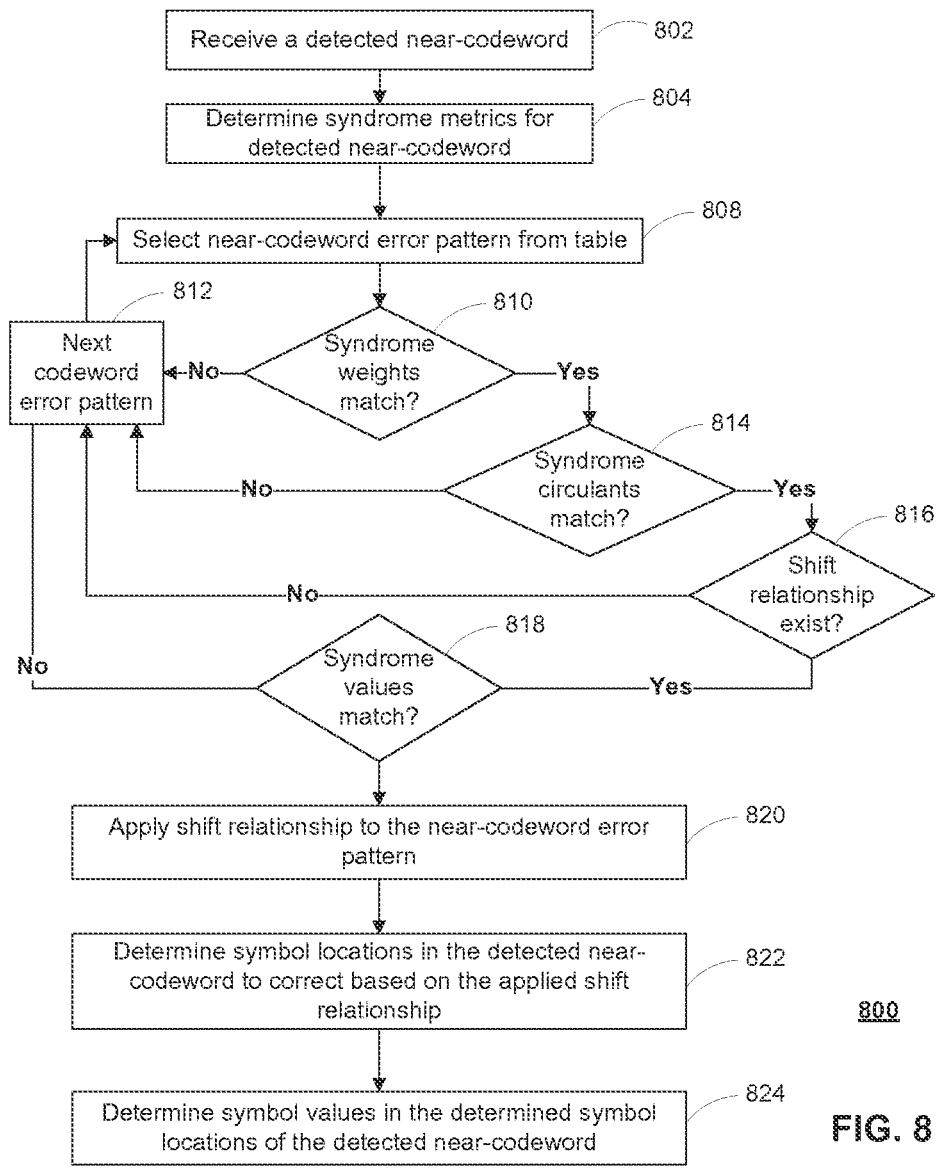
FIG. 8 shows a flowchart of a process for correcting near-codewords in accordance with some embodiments.

FIG. 8 shows illustrative process 800 for correcting near-codewords in accordance with some embodiments. Process 800 may be implemented using, for example, near-codeword decoder 610 of FIG. 6. At 802, a newly detected near-codeword is received. The newly detected near-codeword may be received from, for example, LDPC decoder 602 of FIG. 6. At 804, an error pattern associated with the newly detected near-codeword is determined. The error pattern determination may be completed using, for example, syndrome calculator 614 of FIG. 6. The error pattern may include information regarding the syndrome weight of the newly detected near-codeword, a syndrome pattern substantially similar to syndrome pattern information 704 of FIG. 7. For example, the syndrome pattern may include information regarding the syndrome circulants and syndrome shift locations within the circulants associated with the error or errors in the newly detected near-codeword.

At 808, a near-codeword error pattern is selected from a near-codeword error pattern table. For example, the near-codeword error pattern table may be substantially similar to near-codeword table 616 of FIG. 6 and the near-codeword error pattern may be substantially similar to the data stored in table 616. For example, the error patterns in the error pattern table may be error patterns associated with previously known near-codewords.

At 810, it is determined whether the syndrome weights from the newly detected near-codeword error pattern and the near-codeword error pattern selected from the near-codeword error pattern table match. When the syndrome weights do not match, process 800 proceeds to 812, where a next codeword error pattern is selected from the near-codeword error pattern table. After selecting the next codeword error pattern, process 800 proceeds back to 808 to evaluate the next suitable near-codeword error pattern to evaluate a match to the newly detected near-codeword error pattern.

If the syndrome weights do match at 810, then process 800 proceeds to 814. At 814, it is determined whether the syndrome circulant indices of the newly detected near-codeword error pattern and the selected near-codeword error pattern match. For example, errors in the newly detected near-codeword and the selected near-codeword error pattern may be associated with syndrome circulant indices 0 and 1 in both the newly detected near-codeword error pattern and the selected near-codeword error pattern. Here, the syndrome circulant indices may be considered a match. If the syndrome circulant indices do not match, process 800 proceeds to 812 where the next codeword error pattern is selected as discussed above. When the syndrome circulant indices do match, process 800 proceeds to 816. Syndrome circulant indices represent which syndrome circulant is being referred.

At 816, it is determined whether a cyclic-shift relationship exists between the newly detected near-codeword error pattern and the selected near-codeword error pattern. For example, a cyclic-shift relationship may exist between syndrome shift locations of the newly detected near-codeword error pattern and the selected near-codeword error pattern. For example, as discussed above with regard to near-codeword selector 618 of FIG. 6, the new error pattern and the selected error pattern may be considered a match if errors associated with the new error pattern's syndrome shift locations are of equal spacing within the respective circulant, only equally cyclically shifted to different syndrome shift locations. For example, errors associated with syndrome shift locations 5 and 68 of circulant 0 in the new error pattern may be considered a match to the selected error pattern when errors are associated with syndrome shift locations 0 and 63 of circulant 0 in the selected error pattern and when the syndrome weights match between the two error patterns. Here, the two error patterns match with a cyclic-shift relationship of 5. In some embodiments, the shift relationship may be determined to be 0 indicating, for example, that the syndrome shift locations in the two error patterns are equal. In some embodiments, the matching determinations made at 810, 814, and/or 816 may be implemented using, for example, syndrome calculator 614, near-codeword selector 618, and/or symbol location generator 620, respectively, each of FIG. 6. If no shift relationship exists, process 800 proceeds to 812 where a next codeword error pattern is selected from the near-codeword error pattern table. When a shift relationship does exist, process 800 proceeds to 818.

At 818, it is determined whether the syndrome values from the newly detected near-codeword error pattern and the near-codeword error pattern, selected from the near-codeword error pattern table, match. When the syndrome values do not match, process 800 proceeds to 812, where a next codeword error pattern is selected from the near-codeword error pattern table. After selecting the next codeword error pattern, process 800 proceeds back to 808 to evaluate the next suitable near-codeword error pattern to evaluate for a match to the newly detected near-codeword error pattern. If the syndrome values do match at 818, then process 800 proceeds to 820. In some embodiments, the syndrome values are based on the order of the Galois Field (GF) used to generate the LDPC codes. For example, if a GF(4) field is used, the syndrome value may be any of the elements in the Galois Field, except for zero, since a zero syndrome value would indicate that the syndrome was correct and would not be in the lookup table.

At 820, the cyclic-shift relationship determined at 816 is applied to the selected near-codeword symbol error pattern. For example, an equivalent symbol error pattern may be determined based on cyclically shifted positions of symbols associated with errors in a previously known near-codeword that is associated with the selected near-codeword error pattern. In some embodiments, an equivalent error pattern is not determined, but instead only the positions of the cyclically shifted symbols are determined. Here, the positions of the symbols may be cyclically shifted according to the shift relationship determined at 816. For example, if a shift relationship of 5 is determined at 816 for symbol shift locations 1, 2, 7, 13, and 20 of a previously known error pattern, the shifted symbol locations 6, 7, 12, 18, and 25 may be determined at 820. After applying the shift relationship to the selected near-codeword error pattern, process 800 proceeds to 822.

At 822, a symbol location or locations in the newly detected near-codeword to correct the codeword is determined. For example, the symbol location or locations may be associated with the shifted symbols as determined at 820. In some embodiments, 820 and 822 may be implemented using, for example, symbol location generator 620 of FIG. 6. At 824, after determining appropriate symbol locations of symbols to correct, the symbol values in the symbol error pattern are used to correct the symbols at the determined symbol locations. The symbol value correction may be implemented using, for example, symbol value generator 622 of FIG. 6. In some embodiments, by correcting the symbols in the determined symbols locations, the newly detected near-codeword may be corrected to a valid codeword.

In practice, one or more stages shown in process 800 may be combined with other stages, performed in any suitable order, performed in parallel (e.g., simultaneously or substantially simultaneously), or removed. For example, determining whether syndrome circulant indices match at 814 and determining whether a cyclical shift relationship exists at 816 may be computed substantially simultaneously. Process 800 may be implemented using any suitable combination of hardware and/or software in any suitable fashion.

The above described embodiments of the present discloser are presented for purposes of illustration and not of limitation, and the present disclosure is limited only by the claims which follow.

The foregoing is merely illustrative of the principles of this disclosure and various modifications can be made without departing from the scope of the present disclosure. The above described embodiments of the present disclosure are presented for purposes of illustration and not of limitation, and the present disclosure is limited only by the claims which follow.

What is claimed is:

1. A method for decoding a codeword using an iterative decoder, wherein the iterative decoder comprises a channel detector and an inner iterative decoder, the method comprising:
   in a first decoding mode:
      performing a number of channel iterations on the codeword using the iterative decoder, wherein each channel iteration comprises an iteration of the channel detector and at least one iteration of the inner iterative decoder,
      determining a first syndrome weight after a first time period in the first decoding mode; and
      determining a second syndrome weight after a second time period in the first decoding mode;
   in a second decoding mode:
      determining a true syndrome of the codeword; and
      processing the codeword based on the true syndrome of the codeword; and
   wherein the codeword is processed using the second decoding mode in response to determining that the first and second determined syndrome weights are less than a syndrome weight threshold.

2. The method of claim 1, wherein the true syndrome comprises a syndrome weight, at least one syndrome location, and at least one symbol value corresponding to the syndrome weight.

3. The method of claim 2, wherein the inner iterative decoder is a non-binary Quasi-Cyclic LDPC decoder, and wherein a lookup table comprises a plurality of true syndrome patterns and a related symbol patterns for each of the plurality of true syndrome patterns used in processing the codeword, wherein the symbol pattern comprises at least one symbol location and at least one symbol value used in decoding the codeword based on non-binary Quasi-Cyclic LDPC codes.

4. The method of claim 2, further comprising:
   determining a verification syndrome of the codeword;
   indicating that a valid codeword has been found for the codeword if a determined syndrome weight in the verification syndrome equals zero; and
   indicating that the codeword has failed if the determined syndrome weight in the verification syndrome is greater than zero.

5. The method of claim 1, wherein the first time period is after a first channel iteration, and the second time period is after a second channel iteration, wherein the second channel iteration is the channel iteration after the first channel iteration.

6. The method of claim 1, further comprising:
   in the first decoding mode, determining a third syndrome weight after a third time period in the first decoding mode, wherein the first, second, and third time periods are within the at least one iteration of the inner iterative decoder of a channel iteration; and
   wherein the codeword is processed using the second decoding mode in response to determining that the first, second, and third determined syndrome weights are less than a syndrome weight threshold.

7. The method of claim 1, wherein the determined first and second syndrome weights are approximations of the syndrome weight.

8. The method of claim 1, further comprising:
   buffering at least one subsequent codeword; and
   processing the codeword using a lookup table based on the true syndrome of the codeword, wherein processing the codeword using the lookup table spans a plurality of channel iterations based on the plurality of buffers.

9. An iterative decoder for decoding a codeword comprising a channel detector, an inner iterative decoder, and a lookup table, the iterative decoder is configured to:
  in a first decoding mode:
    perform a number of channel iterations on the codeword using the iterative decoder, wherein each channel iteration comprises an iteration of the channel detector and at least one iteration of the inner iterative decoder;
    determine a first syndrome weight after a first time period in the first decoding mode; and
    determine a second syndrome weight after a second time period in the first decoding mode;
  in a second decoding mode:
    determine a true syndrome of the codeword; and
    process the codeword based on the true syndrome of the codeword; and
  wherein the codeword is processed using the second decoding mode in response to determining that the first and second determined syndrome weights are less than a syndrome weight threshold.

10. The iterative decoder of claim 9, wherein the true syndrome comprises a syndrome weight, at least one syndrome location, and at least one syndrome value corresponding to the syndrome weight.

11. The iterative decoder of claim 10, wherein the inner iterative decoder is a non-binary Quasi-Cyclic LDPC decoder, and wherein a lookup table used to process the codeword comprises a plurality of true syndrome patterns and a related symbol pattern for each of the plurality of true syndrome patterns used in processing the codeword, wherein the symbol pattern comprises at least one symbol location and at least one symbol value used in decoding non-binary Quasi-Cyclic LDPC codes.

12. The iterative decoder of claim 10, further configured to:
  determine an verification syndrome of the codeword;
  indicate that a valid codeword has been found for the codeword if a determined syndrome weight in the verification syndrome equals zero; and
  indicate that the codeword has failed if the determined syndrome weight in the verification syndrome is greater than zero.

13. The iterative decoder of claim 9, wherein the first time period is after a first channel iteration, and the second time period is after a second channel iteration, wherein the second channel iteration is the channel iteration after the first channel iteration.

14. The iterative decoder of claim 9, further configured to:
  in the first decoding mode, determine a third syndrome weight after a third time period in the first decoding mode, wherein the first, second, and third time periods are within the at least one iteration of the inner iterative decoder of a channel iteration; and
  wherein the codeword is processed using the second decoding mode in response to determining that the first, second, and third determined syndrome weights are less than a syndrome weight threshold.

15. The iterative decoder of claim 9, wherein the determined first and second syndrome weights are approximations of the syndrome weight.

16. The iterative decoder of claim 9, further comprising a plurality of buffers, and the iterative decoder further configured to:
  buffer at least one subsequent codeword using the plurality of buffers; and
  process the codeword using the lookup table based on the actual syndrome value of the codeword, wherein processing the codeword using the lookup table spans a plurality of channel iterations based on the plurality of buffers.

* * * * *